United States Patent
Kataoka (10) Patent No.: US 9,680,404 B2
(45) Date of Patent: Jun. 13, 2017

(54) ABNORMALITY DETECTION APPARATUS AND ABNORMALITY DETECTION METHOD

(71) Applicant: Toyota Jidosha Kabushiki Kaisha, Toyota-shi, Aichi-ken (JP)

(72) Inventor: Seiya Kataoka, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/160,554

(22) Filed: May 20, 2016

(65) Prior Publication Data

US 2016/0352262 A1 Dec. 1, 2016

(30) Foreign Application Priority Data

May 25, 2015 (JP) ................................ 2015-105162

(51) Int. Cl.
| | |
|---|---|
| *G01R 31/02* | (2006.01) |
| *H02H 3/04* | (2006.01) |
| *H02H 7/08* | (2006.01) |
| *H02K 11/00* | (2016.01) |
| *H02P 1/00* | (2006.01) |
| *H02P 3/00* | (2006.01) |
| *H02P 5/00* | (2016.01) |
| *H02P 7/00* | (2016.01) |
| *H02P 6/12* | (2006.01) |
| *G01R 31/34* | (2006.01) |
| *G01R 31/42* | (2006.01) |
| *G07C 3/00* | (2006.01) |

(52) U.S. Cl.
CPC .............. *H02P 6/12* (2013.01); *G01R 31/343* (2013.01); *G01R 31/34* (2013.01); *G01R 31/42* (2013.01); *G07C 3/00* (2013.01)

(58) Field of Classification Search
CPC ...... G01R 31/343; G01R 31/42; G01R 31/34; H02K 11/001; G07C 3/00
USPC ......................................................... 318/490
See application file for complete search history.

(56) References Cited

U.S. PATENT DOCUMENTS

| | | | |
|---|---|---|---|
| 2009/0195199 A1* | 8/2009 | Ito ........................... | B60L 3/003 318/400.22 |
| 2011/0241589 A1* | 10/2011 | Danjo ..................... | B60L 3/003 318/453 |

FOREIGN PATENT DOCUMENTS

| | | |
|---|---|---|
| JP | H07-250482 A | 9/1995 |
| JP | 2009-201194 A | 9/2009 |
| JP | 2010-158089 A | 7/2010 |

* cited by examiner

*Primary Examiner* — Kawing Chan
*Assistant Examiner* — Bradley Brown
(74) *Attorney, Agent, or Firm* — Dinsmore & Shohl LLP (57) ABSTRACT

An abnormality detection apparatus configured to detect an abnormality of an inverter provided to control a motor generator when a value obtained by performing a predetermined process for a current value representing electric current flowing between an arm included in the inverter and the motor generator is greater than a threshold value, wherein when a reverse voltage by the motor generator is higher than a system voltage, the threshold value is larger than a value obtained by performing the predetermined process for electric current generated by the reverse voltage.

2 Claims, 7 Drawing Sheets

ABNORMALITY DETECTION APPARATUS AND ABNORMALITY DETECTION METHOD

CROSS-REFERENCE TO RELATED APPLICATIONS

The present application claims priority from Japanese patent application P2015-105162 filed on May 25, 2015, the content of which is hereby incorporated by reference into this application.

BACKGROUND

Field

The present invention relates to abnormality detection.

Related Art

JP 2009-201194A discloses a technique of detecting a short-circuit failure of an inverter provided to control a motor generator. This proposed technique detects a short-circuit failure when the current value representing electric current flowing between an arm included in the inverter and the motor generator is greater than a threshold value under the condition that all diode elements constituting the arm are set OFF (gate blocking condition).

The above prior art technique is on the premise that no electric current flows in the inverter by setting the gate blocking condition in the normal state with no occurrence of a short-circuit failure. When the reverse voltage of the motor generator is higher than the system voltage, however, electric current flows in the inverter even in the normal state under the gate blocking condition. Detection of an abnormality based on such electric current leads to erroneous detection. By taking into account the problem of the prior art, an object of the invention is to avoid erroneous detection when the reverse voltage of the motor generator is higher than the system voltage.

SUMMARY

In order to solve at least part of the problems described above, the invention may be implemented by aspects described below.

According to one aspect of the invention, there is provided an abnormality detection apparatus configured to detect an abnormality of an inverter provided to control a motor generator when a value obtained by performing a predetermined process for a current value representing electric current flowing between an arm included in the inverter and the motor generator is greater than a threshold value. When a reverse voltage by the motor generator is higher than a system voltage, the threshold value is larger than a value obtained by performing the predetermined process for electric current generated by the reverse voltage. The configuration of this aspect avoids erroneous detection induced by the reverse voltage even when the reverse voltage by the motor generator is higher than the system voltage.

In the abnormality detection apparatus of the above aspect, the predetermined process may be a smoothing process of smoothing an absolute value of the current value. The threshold value when the reverse voltage by the motor generator is lower than the system voltage may be smaller than the threshold value when the reverse voltage by the motor generator is higher than the system voltage. The configuration of this aspect enables a more suitable threshold value to be used when the reverse voltage by the motor generator is lower than the system voltage.

In the abnormality detection apparatus of the above aspect, the predetermined process may be a process of obtaining an absolute value of a value obtained by a smoothing process of the current value. The threshold value when the reverse voltage by the motor generator is lower than the system voltage may be equal to the threshold value when the reverse voltage by the motor generator is higher than the system voltage. The configuration of this aspect eliminates the need for classification with regard to whether the reverse voltage by the motor generator is higher or lower than the system voltage.

The invention may be implemented by any of various aspects other than those described above, for example, an abnormality detection method, a computer program configured to implement this method and a non-transitory storage medium in which such a computer program is stored.

DESCRIPTION OF EMBODIMENTS

Figure 1:
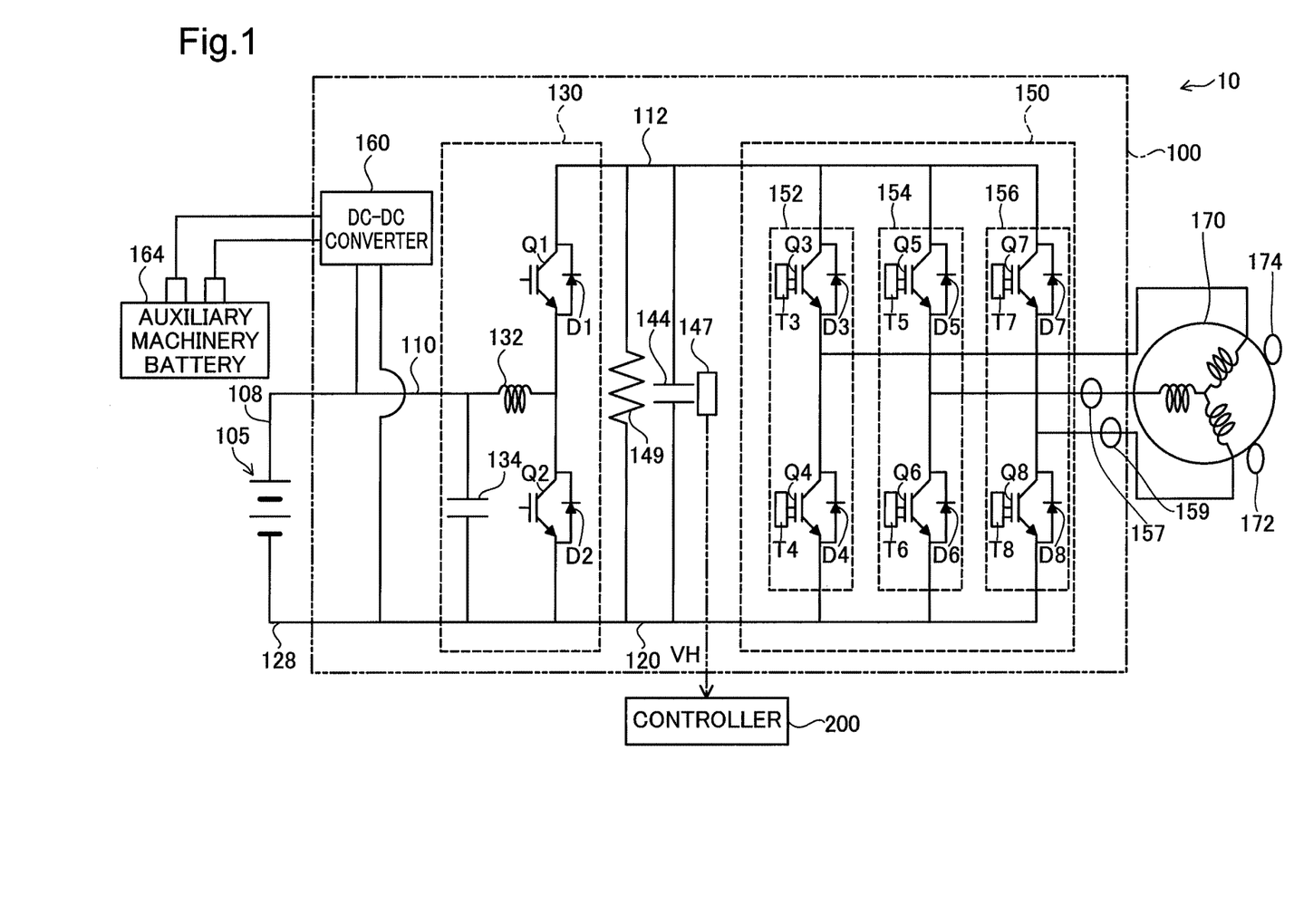
FIG. 1 is a circuit diagram illustrating a power supply control system.

The following describes Embodiment 1. FIG. 1 is a circuit diagram illustrating a power supply control system 10. The power supply control system 10 is configured to control electric power supplied from a battery 105 to a motor generator 170.

The power supply control system 10 includes a power control unit (PCU) 100, the battery 105, a power supply line 108, a ground line 128, an auxiliary machinery battery 164, the motor generator 170 and a controller 200. The power supply control system 10 of the embodiment is mounted on a hybrid vehicle. The hybrid vehicle is a four-wheel vehicle equipped with the motor generator 170 and a gasoline engine (not shown) as the power source.

The battery 105 is connected between the power supply line 108 and the ground line 128. The battery 105 is a secondary battery and is a lithium ion battery according to this embodiment.

The power supply line 108 is connected with a positive electrode of the battery 105. The ground line 128 is connected with a negative electrode of the battery 105. DC current output from the battery 105 flows through the power supply line 108 and the ground line 128.

The PCU 100 is connected between the battery 105 and the motor generator 170. The PCU 100 serves to control electrical connection between the battery 105 and the motor generator 170. The PCU 100 includes a power supply line 110, a power supply line 112, a ground line 120, a converter 130, a capacitor 144, a voltage sensor 147, a discharge resistance 149, an inverter 150, current sensors 157 and 159 and a DC-DC converter 160.

The power supply line 110 and the power supply line 112 are connected with the positive electrode of the battery 105. The ground line 120 is connected with the negative electrode of the battery 105. DC current output from the battery 105 flows through the power line 110, the power line 112 and the ground line 120.

The converter 130 is provided between the power supply line 110 and the power supply line 112. The converter 130 serves to adjust the voltage of DC current supplied from the battery 105 by switching control and supply the current of the adjusted voltage to the inverter 150. The converter 130 includes a reactor 132, a capacitor 134, switching elements Q1 and Q2 and diode elements D1 and D2.

One end of the reactor 132 is connected with the power supply line 110. The other end of the reactor 132 is connected with a middle point between the switching element Q1 and the switching element Q2. The reactor 132 is comprised of a ring-shaped core and a coil wound on the outer circumference of the core. The reactor 132 is used to boost and step down the voltage by the converter 130.

The capacitor 134 is connected between the power supply line 110 and the ground line 120. The capacitor 134 serves to smooth the pulsating flow included in DC voltage between the power supply line 110 and the ground line 120. The capacitor 134 of the embodiment is a film capacitor.

The switching element Q1 and the switching element Q2 are connected in series between the power supply line 112 and the ground line 120. The switching element Q1 is located on the power supply line 112-side of the switching element Q2.

The switching elements Q1 and Q2 are controlled to alternately switch ON/OFF. More specifically, when the switching element Q1 is ON, the switching element Q2 is OFF. When the switching element Q1 is OFF, the switching element Q2 is ON. The converter 130 boosts and steps down the voltage between the battery 105 and the motor generator 170 by adjusting the ON/OFF duty ratio of the switching elements Q1 and Q2.

The diode element D1 is connected between a collector and an emitter of the switching element Q1 to flow the electric current from the emitter toward the collector. The diode element D2 is connected between a collector and an emitter of the switching element Q2 to flow the electric current from the emitter toward the collector.

The capacitor 144 is placed between the converter 130 and the inverter 150. The capacitor 144 serves to smooth the pulsating flow included in DC voltage between the power supply line 112 and the ground line 120. The capacitor 144 of the embodiment is a film capacitor.

The voltage sensor 147 serves to measure a system voltage VH (which denotes a voltage between respective ends of the capacitor 144 and is also called "inverter input voltage") and inputs the measured system voltage VH to the controller 200. The PCU 100 includes the voltage sensor 147 configured to detect the voltage between the respective ends of the capacitor 144.

The discharge resistance 149 is a resistance element provided for discharging in the case where the system voltage VH exceeds a threshold value.

The inverter 150 is connected between the power supply line 112 and the ground line 120. The inverter 150 serves to convert DC current supplied from the battery 105 into AC current and supply the AC current to the motor generator 170 as the driving current for driving the motor generator 170. The inverter 150 is comprised of a U-phase arm 152, a V-phase arm 154 and a W-phase arm 156. The U-phase arm 152, the V-phase arm 154 and the W-phase arm 156 are connected in series between the power supply line 112 and the ground line 120.

The U-phase arm 152 includes a switching element Q3, a switching element Q4, a diode element D3 and a diode element D4. The switching element Q3 and the switching element Q4 are connected in series. The diode element D3 is connected between a collector and an emitter of the switching element Q3 to flow the electric current from the emitter toward the collector. The diode element D4 is connected between a collector and an emitter of the switching element Q4 to flow the electric current from the emitter toward the collector.

The V-phase arm 154 includes a switching element Q5, a switching element Q6, a diode element D5 and a diode element D6. The switching element Q5 and the switching element Q6 are connected in series. The diode element D5 is connected between a collector and an emitter of the switching element Q5 to flow the electric current from the emitter toward the collector. The diode element D6 is connected between a collector and an emitter of the switching element Q6 to flow the electric current from the emitter toward the collector.

The W-phase arm 156 includes a switching element Q7, a switching element Q8, a diode element D7 and a diode element D8. The switching element Q7 and the switching element Q8 are connected in series. The diode element D7 is connected between a collector and an emitter of the switching element Q7 to flow the electric current from the emitter toward the collector. The diode element D8 is connected between a collector and an emitter of the switching element Q8 to flow the electric current from the emitter toward the collector.

IGBTs (insulated-gate bipolar transistors) are employed for the switching elements Q3 to Q8 of the embodiment. Drive circuits T3 to T8 are respectively connected with the switching elements Q3 to Q8 to switch ON/OFF.

A middle point between the switching element Q3 and the switching element Q4 is connected with one end of a U-phase coil of the motor generator 170. A middle point between the switching element Q5 and the switching element Q6 is connected with one end of a V-phase coil of the motor generator 170. A middle point between the switching element Q7 and the switching element Q8 is connected with one end of a W-phase coil of the motor generator 170. The other end of the U-phase coil, the other end of the V-phase coil and the other end of the W-phase coil are connected with a middle point in the motor generator 170.

The current sensor 157 is placed on a wiring arranged to connect the V-phase arm 154 with the V-phase coil. The current sensor 159 is placed on a wiring arranged to connect the W-phase arm 156 with the W-phase coil. The current sensor 157 and the current sensor 159 serve to measure the values of electric current flowing in the motor generator 170 and output the measured current values to the controller 200.

The DC-DC converter 160 is connected between the power supply line 110 and the ground line 120. The DC-DC converter 160 serves to charge the auxiliary machinery battery 164 and supply electric power to auxiliary machinery (not shown).

The auxiliary machinery battery 164 is connected with the DC-DC converter 160. The auxiliary machinery battery 164 serves to supply electric power used for driving the auxiliary machinery, to the auxiliary machinery. The auxiliary machinery of the embodiment includes the current sensors 157 and 159, a compressor for air conditioner and a pump for power steering.

The motor generator 170 is connected with the inverter 150. The motor generator 170 serves as a motor when receiving supply of AC current from the inverter 150. The motor generator 170 serves as a generator during deceleration of the motor vehicle (regenerative braking) to regenerate the kinetic energy as electrical energy.

The motor generator 170 includes a resolver 172 and a temperature sensor 174. The resolver 172 serves to measure the rotational angle of a rotor of the motor generator 170. The temperature sensor 174 serves to measure the temperature of the motor generator 170. The controller 200 controls the respective components of the power supply control system 10 described above.

Figure 2:
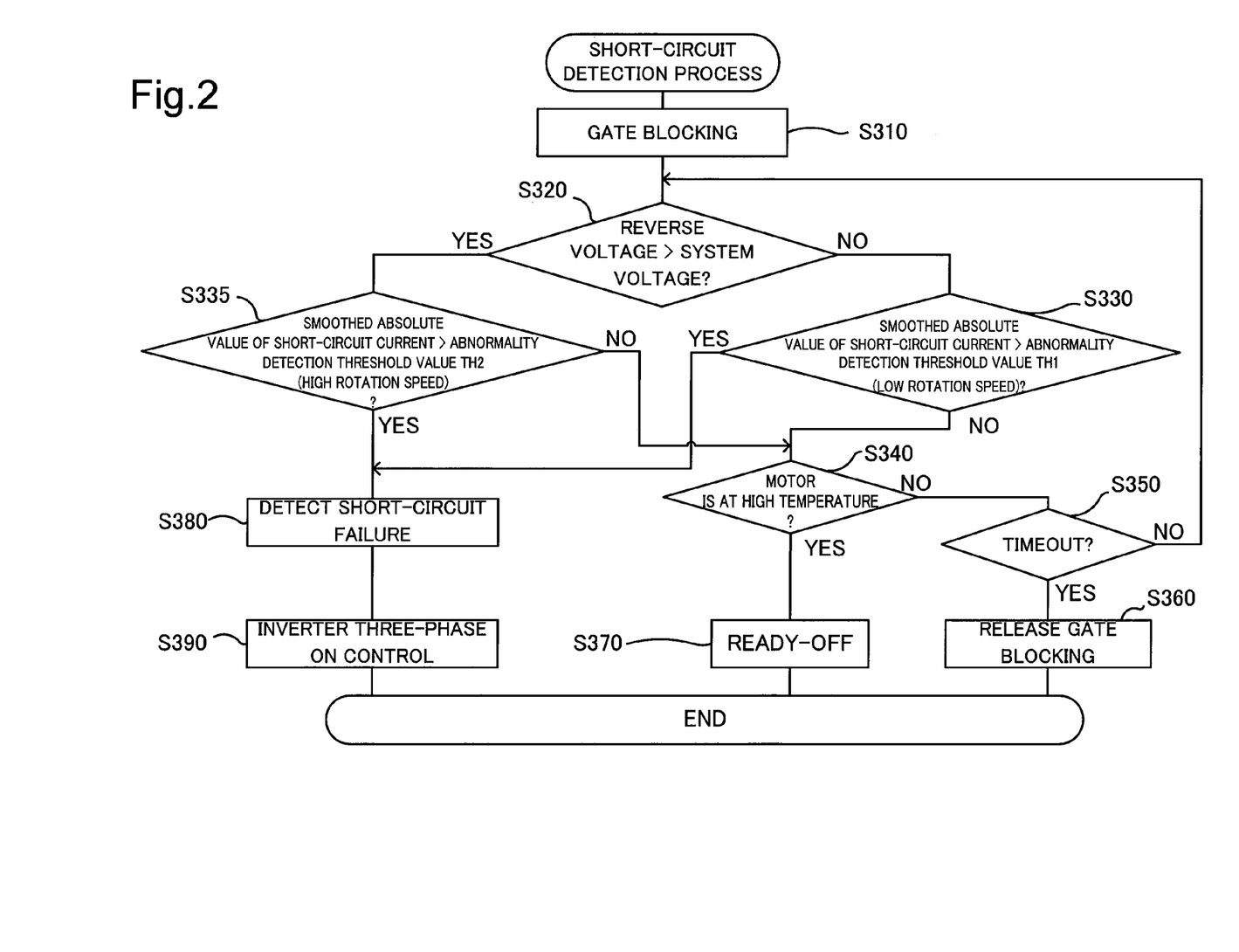
FIG. 2 is a flowchart showing a short-circuit detection process according to Embodiment 1.

FIG. 2 is a flowchart showing a short-circuit detection process. The short-circuit detection process denotes a process of detecting a short-circuit failure of the inverter 150. The short-circuit detection process is triggered when the controller 200 detects a state that is likely to cause a short-circuit failure in the inverter 150. Detection of the state that is likely to cause a short-circuit failure may be, for example, based on measurement of overcurrent by either of the current sensors 157 and 159 or detection of an abnormality by any of the drive circuits T3 to T8.

The controller 200 first performs gate blocking (S310). The gate blocking means sending a command to switch OFF all the switching elements Q3 to Q8 to the drive circuits T3 to T8.

The controller 200 subsequently determines whether a reverse voltage Vbe is higher than the system voltage VH (S320). The reverse voltage Vbe is calculated by an equation given below:

$$Vbe \,[V] = Kbe \,[V/\text{rpm}] \times Nm \,[\text{rpm}] \quad (1)$$

In the equation, Kbe denotes a reverse voltage constant and is a fixed value stored in advance in the controller 200, and Nm denotes a rotation speed of the motor generator 170.

When the reverse voltage Vbe is equal to or lower than the system voltage VH (S320: NO), the controller 200 subsequently determines whether a smoothed absolute value of short-circuit current (method of computation will be described later) is greater than an abnormality detection threshold value TH1 (S330).

In the state that the reverse voltage Vbe is equal to or lower than the system voltage VH, when the switching elements Q3 to Q8 have no short-circuit failure but are all normal, substantially no electric current flows in the current sensors 157 and 159. As a result, the smoothed absolute value of short-circuit current is kept at approximately zero, so that it is determined that the smoothed absolute value of short-circuit current is equal to or less than the abnormality detection threshold value TH1 (S330: NO).

When the smoothed absolute value of short-circuit current is equal to or less than the abnormality detection threshold value TH1 (S330: NO), the controller 200 subsequently determines whether the temperature of the motor generator 170 is higher than a reference temperature (S340). When the temperature of the motor generator 170 is equal to or lower than the reference temperature (S340: NO), the controller 200 determines whether a timeout is detected (S350). More specifically, the controller 200 determines whether a predetermined time has elapsed since start of the short-circuit detection process.

When no timeout is detected (S350: NO), the controller 200 returns to S320. When the above series of processing is repeated to detect a timeout (S350: YES), the controller 200 releases the gate blocking due to no detection of a short-circuit failure (S360) and terminates the short-circuit detection process. Releasing the gate blocking returns the vehicle to the ordinary drive mode.

When the temperature of the motor generator 170 reaches the reference temperature (S340: YES), on the other hand, the controller 200 sets the control state of the vehicle to READY-OFF state (S370) and terminates the short-circuit detection process. The READY-OFF state means the state that the driving force of the vehicle is stopped.

When the smoothed absolute value of short-circuit current is greater than the abnormality detection threshold value TH1 (S330: YES), on the other hand, the controller 200 detects a short-circuit failure (S380). The controller 200 then performs inverter three-phase ON control (S390) and terminates the short-circuit detection process.

The inverter three-phase ON control means setting all the switching elements Q3 to Q8 to ON. The inverter three-phase ON control decreases the absolute value of electric current flowing in a region that has a short-circuit failure.

Figure 3:
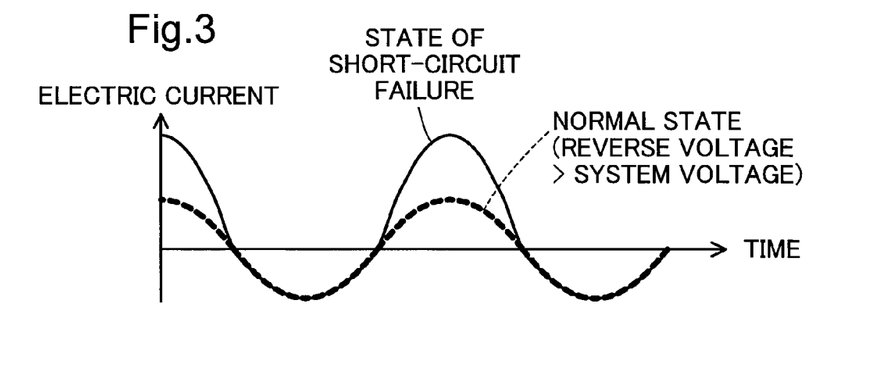
FIG. 3 is a graph showing time changes of measured current value.

The following describes the smoothed absolute value of short-circuit current. FIG. 3 is a graph showing time changes of current value measured by either of the current sensors 157 and 159. FIG. 3 shows the time changes in the case where a short-circuit failure occurs in one of the switching elements Q3 to Q8 and in the case where the reverse voltage Vbe is higher than the system voltage VH in the normal state. In these cases, the electric current flows as shown in FIG. 3 even under gate blocking.

Figure 4:
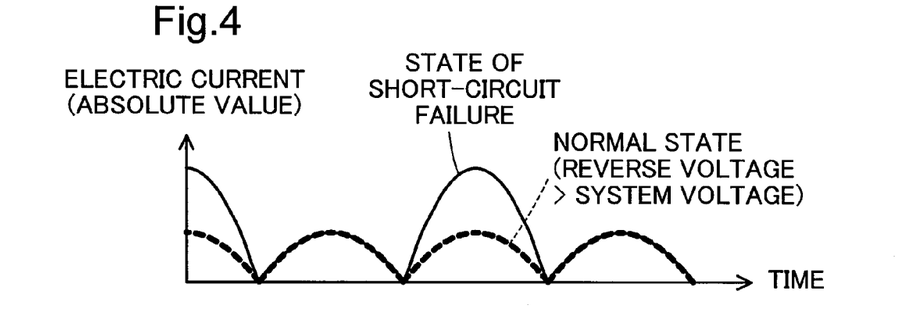
FIG. 4 is a graph showing time changes of absolute value of the current value.
Figure 5:
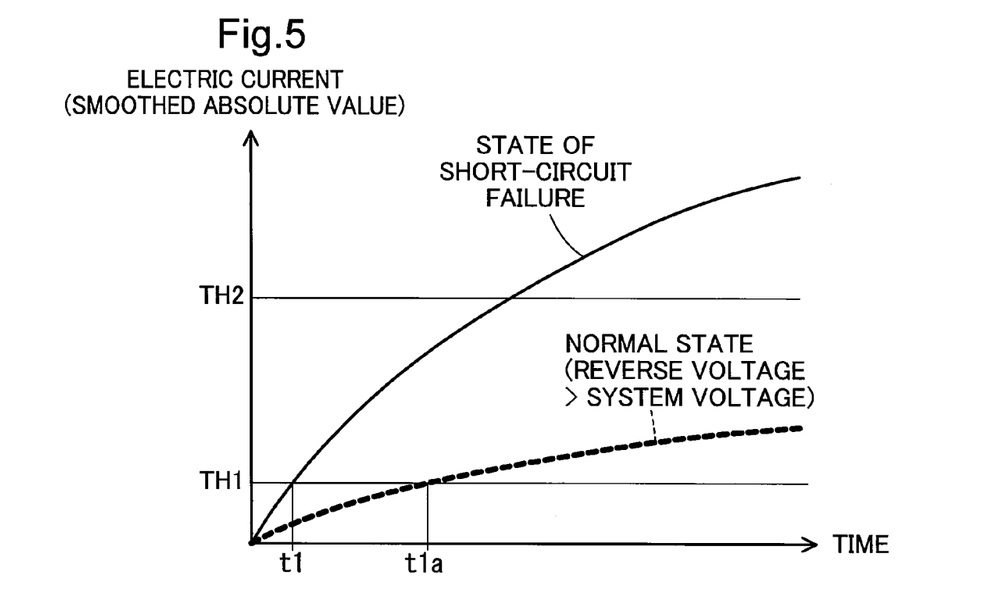
FIG. 5 is a graph showing results of a smoothing process of the absolute value of the current value.

FIG. 4 is a graph showing time changes of the absolute value of the above current value. FIG. 5 is a graph showing results of a smoothing process of the absolute value of the current value. The smoothing process herein denotes a process of removing the AC component and integrating the DC component. Curves in the graph of FIG. 5 indicate time changes of the "smoothed absolute value of short-circuit current" described above.

As shown in FIG. 5, in the state of a short-circuit failure, the smoothed absolute value of short-circuit current is greater than the abnormality detection threshold value TH1 after a time t1. In the case where the reverse voltage Vbe is equal to or lower than the system voltage VH in the normal state (not shown in FIG. 5), the measured current value is kept at approximately zero as described above, so that the smoothed absolute value of short-circuit current is also kept at approximately zero. Using the abnormality detection threshold value TH1 thus allows for discrimination between the normal state and the state of a short-circuit failure.

Figure 6:
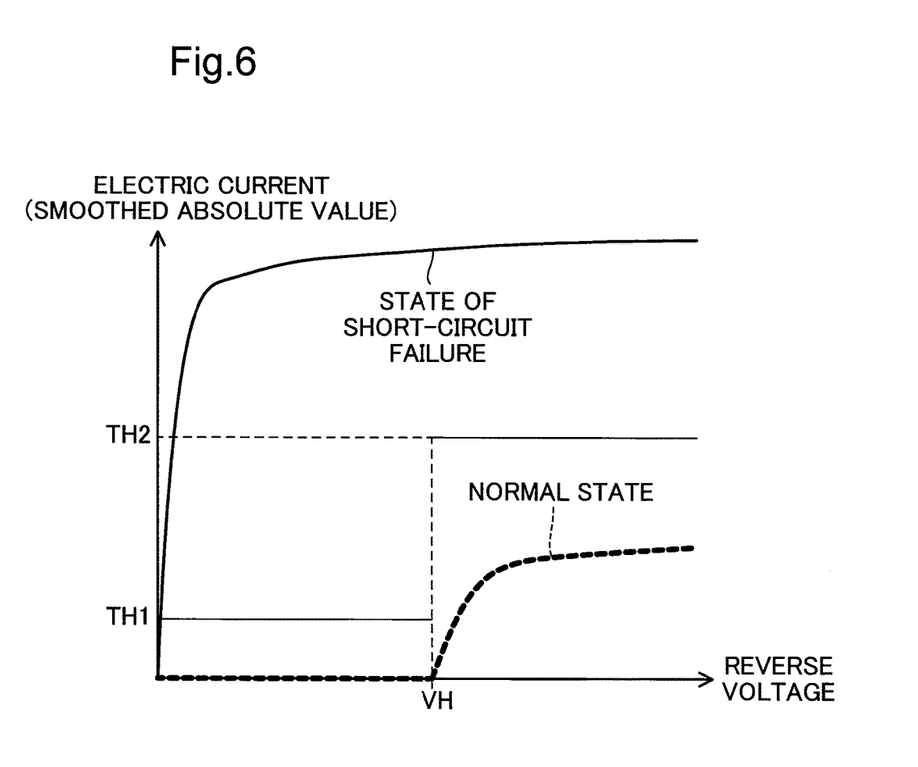
FIG. 6 is a graph showing relationship between smoothed absolute value of short-circuit current and reverse voltage under gate blocking condition.

When the reverse voltage Vbe is higher than the system voltage VH (S320: YES), the controller 200 subsequently determines whether the smoothed absolute value of short-circuit current is greater than an abnormality detection threshold value TH2 (S335). The abnormality detection threshold value TH2 is greater than the abnormality detection threshold value TH1 as shown in FIG. 5 and FIG. 6 (described later).

As described above, when the reverse voltage Vbe is higher than the system voltage VH (S320: YES), even in the normal state, electric current flows under the gate blocking condition to generate the AC component as shown in FIG. 3. This is attributed to that electric current flows in the forward direction of the diode elements D3 to D8 when the reverse voltage Vbe is higher than the system voltage VH. This current value is affected by the inductance of the motor generator 170.

As a result, the smoothed absolute value of short-circuit current is not kept at zero even in the normal state as shown in FIG. 4 and reaches the abnormality detection threshold value TH1 at a time t1a as shown in FIG. 5. Using the abnormality detection threshold value TH1 thus leads to erroneous detection.

When the reverse voltage Vbe is higher than the system voltage VH, the abnormality detection threshold value TH2 greater than the abnormality detection threshold value TH1 is accordingly used for detection of a short-circuit failure. The abnormality detection threshold value TH2 is set to be larger than the smoothed absolute value of short-circuit current that is likely to be provided in the normal state and smaller than the smoothed absolute value of short-circuit current in the state of a short-circuit failure. The state of larger than the smoothed absolute value of short-circuit current that is likely to be provided in the normal state leads to the state of larger than the smoothed absolute value of electric current generated by the reverse voltage Vbe.

FIG. 6 is a graph showing relationship between the smoothed absolute value of short-circuit current and the reverse voltage Vbe. FIG. 6 shows the values after elapse of a predetermined time period since the start of the short-circuit detection process. The values in the state of a short-circuit failure are those without inverter three-phase ON control.

When the reverse voltage Vbe is higher than the system voltage VH, the smoothed absolute value of short-circuit current increases with an increase in reverse voltage as shown in FIG. 6. The state that the reverse voltage Vbe is higher than the system voltage VH may be regarded as the state that the rotation speed of the motor generator 170 is higher than a predetermined value.

The series of processing in response to the affirmative answer YES at S335 is the same as the series of processing in response to the affirmative answer YES at S330. The series of processing in response to the negative answer NO at S335 is the same as the series of processing in response to the negative answer NO at S330.

As described above, the configuration of Embodiment 1 detects a short-circuit failure in a short time period (time t1 in the above example) in the case where the reverse voltage Vbe is equal to or lower than the system voltage VH, while avoiding erroneous detection in the case where the reverse voltage Vbe is higher than the system voltage VH.

Figure 7:
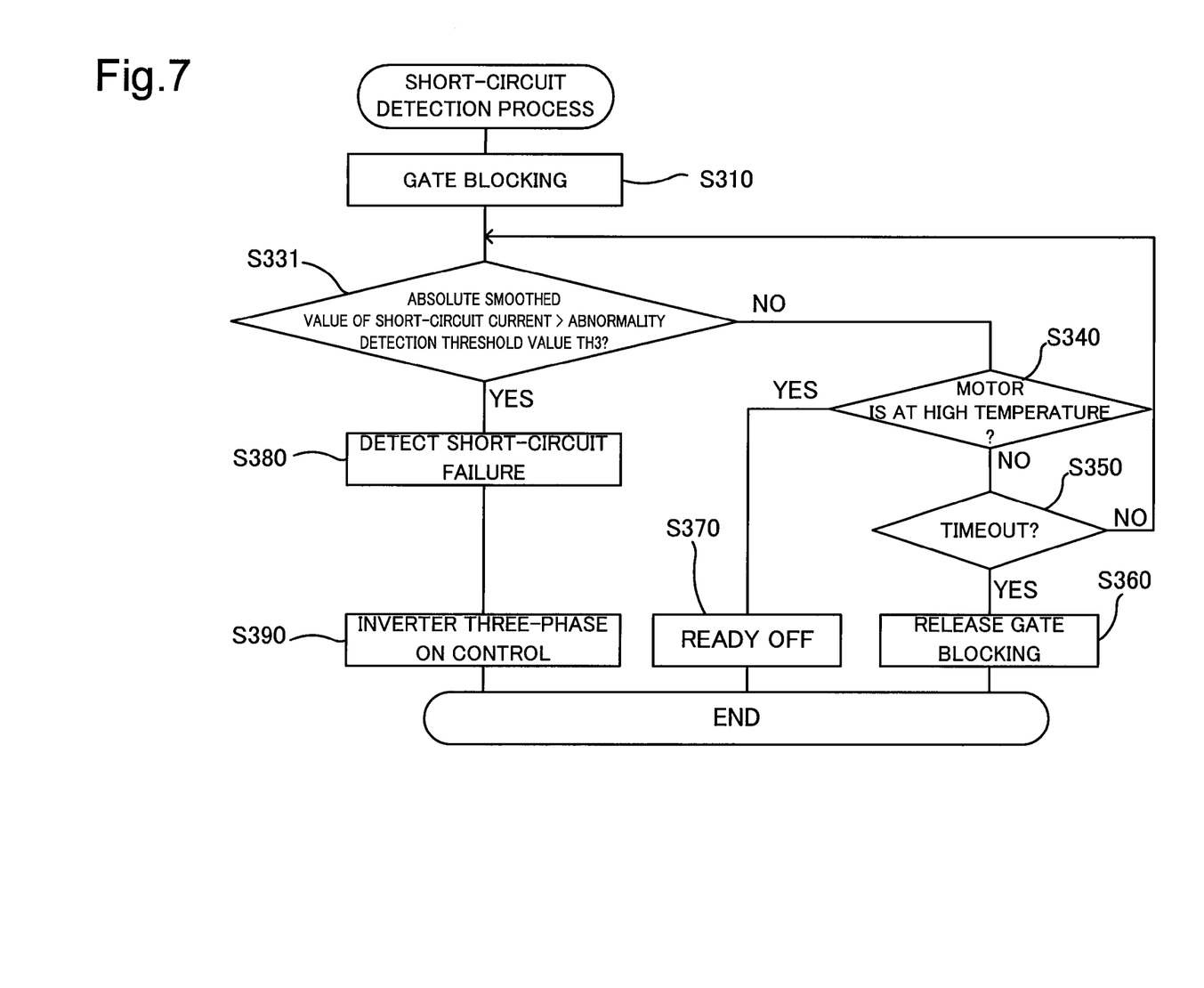
FIG. 7 is a flowchart showing a short-circuit detection process according to Embodiment 2.

The following describes Embodiment 2. Embodiment 2 also uses the circuit shown in FIG. 1. FIG. 7 is a flowchart showing a short-circuit detection process according to Embodiment 2. The steps having the same step numbers as those in the short-circuit detection process of Embodiment 1 have the same processing details as those of Embodiment 1 and are thus not described in detail.

According to Embodiment 2, after the gate blocking (S310), the controller 200 performs determination of S331 without the comparison between the reverse voltage Vbe and the system voltage VH (S320). At S331, the controller 200 determines whether an absolute smoothed value of short-circuit current is greater than an abnormality detection threshold value TH3.

Figure 8:
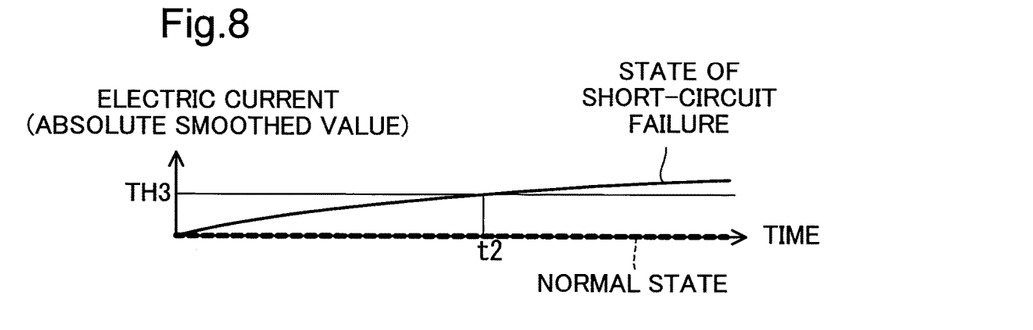
FIG. 8 is a graph showing time changes of absolute smoothed value of short-circuit current.

FIG. 8 is a graph showing time changes of absolute smoothed value of short-circuit current obtained from the current value shown in FIG. 3. Unlike the smoothed absolute value of short-circuit current of Embodiment 1, the absolute smoothed value of short-circuit current is the absolute value obtained after a smoothing process.

As shown in FIG. 3, the AC current measured has an almost ideal sinusoidal waveform in the case where the reverse voltage Vbe is higher than the system voltage VH in the normal state. The value obtained by the smoothing process of the ideal sinusoidal wave is kept at approximately zero, so that the absolute value of this smoothed value is also kept at approximately zero.

As shown in FIG. 8, the abnormality detection threshold value TH3 is a positive value and is greater than an absolute smoothed value of electric current generated by the reverse voltage Vbe. In the case where the reverse voltage Vbe is higher than the system voltage VH in the state without a short-circuit failure, the negative answer NO is provided at S331. The series of processing in response to the negative answer NO at S331 is the same as the series of processing in response to the negative answer NO at S335 of Embodiment 1.

In the case where the reverse voltage Vbe is not higher than the system voltage VH in the normal state, the measurement value by the current sensor 157 or 159 is kept at approximately zero, so that the absolute smoothed value of short-circuit current is also kept at approximately zero. In this state, the negative answer NO is also provided at S331. The series of processing in response to the negative answer NO at S331 is the same as the series of processing in response to the negative answer NO at S330 of Embodiment 1.

In the state of a short-circuit failure, on the other hand, the DC component is superposed on the sinusoidal wave as shown in FIG. 3. This DC component is generated by the occurrence of a short-circuit failure in any of the switching elements Q3 to Q8.

In this case, the DC component described above increases the current value after the smoothing process with time as shown in FIG. 8. The absolute value of the smoothed value, i.e., the absolute smoothed value, increases with time and reaches the abnormality detection threshold value TH3 at a time t2. As a result, the affirmative answer YES is provided at S331. The series of processing in response to the affirmative answer YES at S331 is the same as the series of processing in response to the affirmative answer YES at S335 of Embodiment 1.

In the case where the reverse voltage Vbe is not higher than the system voltage VH in the state of a short-circuit failure, the DC component is included in the measurement value by the current sensor 157 or 159. Accordingly the affirmative answer YES is also provided at S331. The series of processing in response to the affirmative answer YES at S331 is the same as the series of processing in response to the affirmative answer YES at S330 of Embodiment 1.

As described above, the configuration of Embodiment 2 avoids erroneous detection without classification with regard to the magnitude relationship between the reverse voltage Vbe and the system voltage VH.

The invention is not limited to any of the embodiments, the examples and the modifications described above but may be implemented by a diversity of other configurations without departing from the scope of the invention. For example, the technical features of any of the embodiments, the examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein. Some examples of possible modification are given below.

Figure 9:
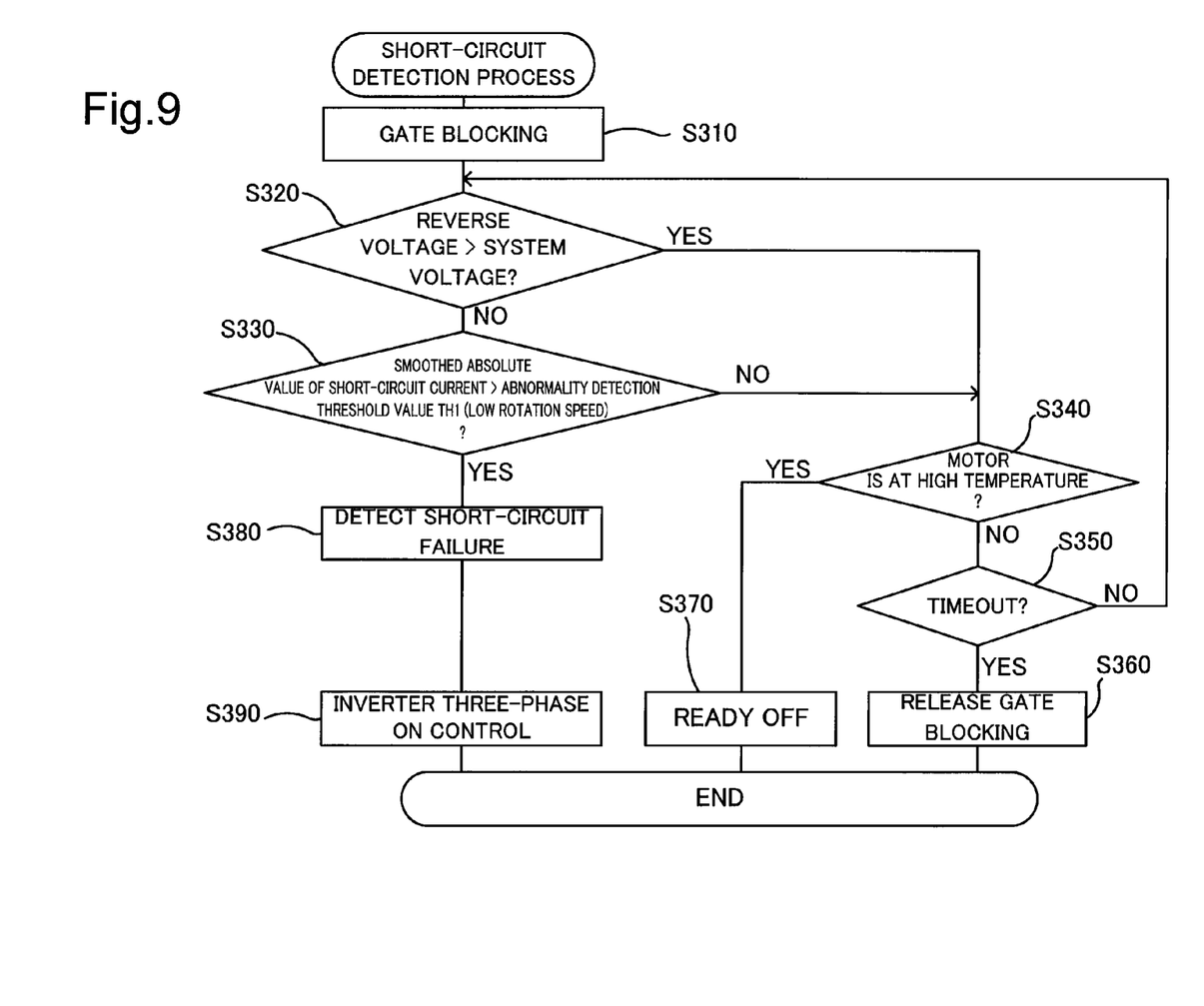
FIG. 9 is a flowchart showing a short-circuit detection process according to a modification.

FIG. 9 is a flowchart showing a short-circuit detection process according to a modification. The following describes differences from the short-circuit detection process of Embodiment 1. According to the modification, the controller 200 performs the determination of S340 in response to the affirmative answer YES at S320. In other words, the controller 330 does not perform the comparison between the smoothed absolute value of short-circuit current and the abnormality detection threshold value TH1 (S330) in the case where the reverse voltage Vbe is higher than the system voltage VH. Non-execution of S330 leads to no abnormality detection. This avoids erroneous detection.

The power supply control system may be mounted on an electric vehicle or a fuel cell vehicle or may be mounted on any of other transportation equipment (for example, two-wheel vehicle or train).

The battery may be a nickel metal hydride battery or a lead acid battery.

The capacitor may be an electrolytic capacitor.

The PCU may include a sensor configured to measure voltage between respective ends of the capacitor, in addition to the voltage sensor 147.

A power transistor or a thyristor may be employed for the switching element.

Among the wiring arranged to connect the U-phase arm with the U-phase coil, the wiring arranged to connect the V-phase arm with the V-phase coil and the wiring arranged to connect the W-phase arm with the W-phase coil, current sensors may be provided in all the three wirings or current sensors may be provided in two of the wirings including the wiring arranged to connect the U-phase arm with the U-phase coil.

The reverse voltage Vbe may be obtained by referring to a characteristic map of the rotation speed Nm to the reverse voltage Vbe, instead of the above computation.

The invention claimed is:

1. An abnormality detection apparatus configured to detect an abnormality of an inverter provided to control a motor generator and to set switching elements included in the inverter ON when a value obtained by performing a smoothing process for an absolute value of a current value representing electric current flowing between an arm included in the inverter and the motor generator is greater than a first threshold value or a second threshold value, wherein:
   when a reverse voltage of the motor generator is smaller than a system voltage, the abnormality detection apparatus uses the first threshold value to detect the abnormality;
   when the reverse voltage of the motor generator is larger than the system voltage, the abnormality detection apparatus uses the second threshold value to detect the abnormality;
   the second threshold value is larger than a value obtained by performing the smoothing process for electric current generated by the reverse voltage; and
   the first threshold value is smaller than the second threshold value.

2. An abnormality detection method comprising detecting an abnormality of an inverter provided to control a motor generator and setting switching elements included in the inverter ON when a value obtained by performing a smoothing process for an absolute value of a current value representing electric current flowing between an arm included in the inverter and the motor generator is greater than a first threshold value or a second threshold value, wherein:
   when a reverse voltage of the motor generator is smaller than a system voltage, the first threshold value is used to detect the abnormality;
   when the reverse voltage of the motor generator is larger than the system voltage, the second threshold value is used to detect the abnormality;
   the second threshold value is larger than a value obtained by performing the smoothing process for electric current generated by the reverse voltage; and
   the first threshold value is smaller than the second threshold value.

* * * * *